United States Patent [19]

Blossfeld et al.

[11] Patent Number: 5,530,394

[45] Date of Patent: Jun. 25, 1996

[54] CMOS CIRCUIT WITH INCREASED BREAKDOWN STRENGTH

[75] Inventors: Lothar Blossfeld, Breitnau; Ulrich Theus, Gundelfingen; Mario Motz, Endigen, all of Germany

[73] Assignee: Deutsch ITT Industries GmbH, Freiburg, Germany

[21] Appl. No.: 318,355

[22] Filed: Oct. 5, 1994

[30] Foreign Application Priority Data

Sep. 10, 1993 [DE] Germany .......................... 43 34 513.1

[51] Int. Cl.$^6$ ............................ H01J 19/82; G05F 1/10; G05F 3/16; H03K 3/59

[52] U.S. Cl. ........................ 327/530; 327/535; 327/537; 327/538; 327/539; 327/540; 327/541; 327/511; 323/313

[58] Field of Search ...................... 327/108, 387, 327/389, 391, 394, 399, 404, 427, 434, 437, 530, 535, 537, 538, 539, 540, 541, 543, 511; 323/313, 315; 330/257

[56] References Cited

U.S. PATENT DOCUMENTS

| | | | |
|---|---|---|---|
| 4,442,398 | 4/1984 | Bertails et al. | 323/315 |
| 4,929,884 | 5/1990 | Birds et al. | 323/313 |
| 5,099,146 | 3/1992 | Miki et al. | 327/543 |
| 5,124,631 | 6/1992 | Terashima | 323/313 |
| 5,369,354 | 11/1994 | Mori | 323/313 |

FOREIGN PATENT DOCUMENTS 4242989732  5/1994  Germany .

*Primary Examiner*—David C. Nelms
*Assistant Examiner*—Trong Phan
*Attorney, Agent, or Firm*—Plevy & Associates

[57] ABSTRACT

In a CMOS circuit having at least a first subcircuit coupled between a first point of potential and a first circuit node, and having a second subcircuit coupled between a second circuit node and a second point of potential, said first and second circuit nodes being coupled together, the improvement in combination therewith, comprising: first circuit means coupled to the first point of potential for converting the first potential to a third potential as a function of the magnitude of said first potential, said third potential being of a value inbetween the first and second potentials; a FET having source, drain, gate and well terminals, said source terminal being coupled to said well terminal and to said first circuit node, said third potential being applied to said gate terminal, said drain terminal being coupled to said second circuit node; wherein said FET, in conjunction with said first circuit means, operates to selectively provide a difference in potential between said first and second circuit nodes, thereby preventing voltage breakdown within said subcircuits.

21 Claims, 4 Drawing Sheets

CMOS CIRCUIT WITH INCREASED BREAKDOWN STRENGTH

FIELD OF THE INVENTION

The present invention relates to improvements in CMOS circuit technology, and more particularly, to a circuit for increasing the breakdown strength of a CMOS circuit.

BACKGROUND OF THE INVENTION

CMOS circuits are commonly designed for a permissible voltage range of only 5 volts. The technological manufacturing parameters and the geometrical design rules of the individual regions are optimized for this voltage range. However, there are applications for CMOS circuits which lie outside this usual 5 V supply and in which the cost of a separate, stable 5 V supply network would be prohibitive. Such applications are, for example, spatially separated circuits for electronic transducers, sensors, or controllers in industrial or commercial equipment. One important application is the automotive sector with a very unstable on-board system of 12 V or 24 V. It is possible to generate a regulated supply voltage of 5 V on the chip; see, for example, German Patent No. 42 42 989.7-32 to U. Theus and assigned to Deutsche ITT Industries GMBH, the assignee herein. However, this technique increases the amount of chip area required and, hence, the manufacturing costs. In many cases, separate voltage stabilization on the semiconductor chip is not necessary, namely if the circuit itself is relatively insensitive to voltage fluctuations and only few circuit pans require the full breakdown strength.

The following gives a brief survey of the main differences in the breakdown strengths of p- and n-channel transistors. The most critical types are n-channel transistors, whose drain-source breakdown voltage determines the maximum permissible supply voltage. If, however, the heavily n-type doped drain region of the n-channel device is embedded in a lightly doped n-type well for receiving a space-charge region, the maximum permissible drain-source voltage will increase to above 24 V with unchanged manufacturing parameters. A voltage-proof n-channel transistor is thus available.

The p-channel transistor permits a drain-bulk voltage of only −5 V if its channel length is less than 1.2 µm. The maximum permissible drain-bulk voltage increases to at least 12 V if the channel length is greater than 3.75 µm. In the following, the negative sign in the case of the voltage values of the p-channel transistors will be omitted for simplicity, i.e., the values are to be understood as absolute values. If the n-type well (bulk region) of the p-channel transistor is collected to the source electrode, the breakdown strength relates to the drain-source current path in the n-type well. If, on the other hand, the n-type well is connected to another source of potential, the maximum permissible drain-source voltage decreases by the difference in potential between the n-type well and the source electrode.

It is, therefore, the object of the present invention to provide a circuit whereby subcircuits which are at different voltage levels within a CMOS monolithic integrated circuit can be connected together in the simplest possible manner taking into account the desired breakdown strength.

SUMMARY OF THE INVENTION

The present invention is directed to a CMOS circuit having at least a first subcircuit coupled between a first point of potential and a first circuit node, and having a second subcircuit coupled between a second circuit node and a second point of potential, said first and second circuit nodes being coupled together, wherein the improvement in combination therewith, comprises: first circuit means coupled to the first point of potential for converting the first potential to a third potential as a function of the magnitude of said first potential, said third potential being of a value inbetween the first and second potentials; a FET having source, drain, gate and well terminals, said source terminal being coupled to said well terminal and to said first circuit node, said third potential being applied to said gate terminal, said drain terminal being coupled to said second circuit node; wherein said FET, in conjunction with said first circuit means, operates to selectively provide a difference in potential between said first and second circuit nodes, thereby preventing voltage breakdown within said subcircuits.

According to another embodiment of the invention, a Hall-sensor circuit comprises: a first p-channel FET having a well terminal coupled to a source terminal which is coupled to a first circuit node, a drain terminal coupled to a second circuit node, and a gate terminal; a protection circuit including a second p-channel FET having a drain terminal coupled to said first circuit node, a source terminal coupled to a first point of potential, and a gate terminal; a Hall plate having an input terminal coupled to said second circuit node, an output terminal coupled to a second point of reference potential, and first and second voltage taps, said Hall plate operative to sense a magnetic field and provide a difference in potential between said first and second voltage taps as a function of the magnetic field; a bias source coupled to said gate terminal of said first p-channel FET to provide a third potential thereat as a function of the magnitude of said first potential; a regulator circuit for providing a control signal to the gate terminal of said second p-channel FET, said regulator circuit thereby regulating output current of said Hall plate; whereby said cascade circuit is operative to provide a difference in potential between said first and second nodes, thereby increasing the breakdown strength of said Hall-sensor circuit.

The breakdown strength of monolithic integrated circuits is determined essentially by space-charge regions in the semiconductor material. The present invention takes advantage of the recognition that large voltage differences between two nodes can be reduced in steps by means of a one- or multi-stage p-channel cascade circuit, with the voltage being divided by the individual cascade stages into partial voltages of approximately equal magnitude. The partial voltages themselves must, of course, be smaller than the permissible breakdown voltages of the individual cascade stages. The operating range of each cascade stage is determined by a fixed potential, to which the respective gate electrode is connected. According to the invention, the cascade stages are built with p-channel transistors whose respective well potentials are approximately equal to or slightly above the source potentials. The gate electrodes are connected to associated fixed potentials which are generated by a bias source and are controlled as a function of the magnitude of the supply voltage. The control is to cause the cascode stages to be already be fully active in the starting range of the supply voltage. To increase the breakdown strength at the full supply voltage, p-channel cascade stages are used in the p-channel current path and voltage-proof n-channel transistors in the less critical n-channel path. In addition, the use of space-charge-free polysilicon resistors for the signal path is possible in both directions.

3

BRIEF DESCRIPTION OF THE DRAWINGS

The invention and further embodiments thereof will now be explained in more detail with references to the accompanying drawings, in which.

DETAILED DESCRIPTION OF THE PREFERRED EMBODIMENTS

Figure 1:
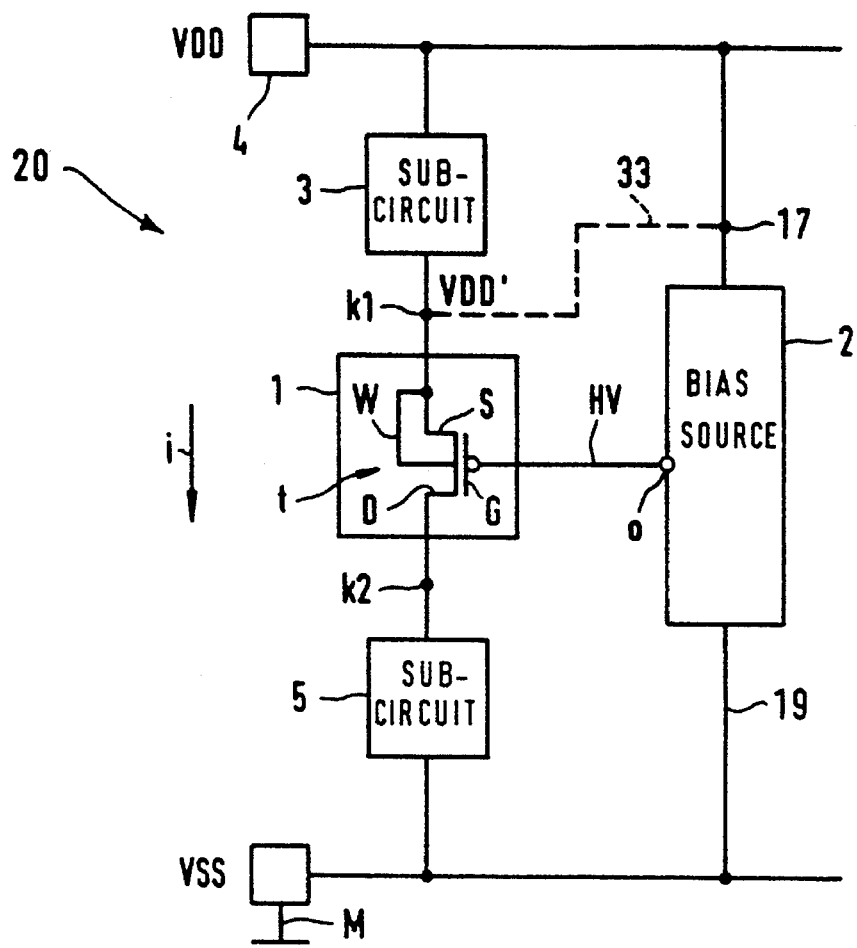
FIG. 1 is a block diagram of a simple embodiment of the invention.

Referring to FIG. 1, the circuit 20 has a contact pad 4, to which a positive supply voltage VDD is applied. Contact pad 4 feeds a first subcircuit 3 and a bias source 2. On the side remote from the positive supply voltage, the first subcircuit 3 has a first node k1, which is connected to the positive input of a cascode circuit 1. The negative output of the cascode circuit 1 is coupled to a second node k2, which is also the positive input to a second subcircuit 5, whose negative output is connected to a source of negative supply voltage VSS, which is connected to ground potential M.

In the embodiment of FIG. 1, the cascode circuit 1 is formed by a single p-channel transistor t having a source terminal S and well terminal W which are connected to the first node k1, and having a drain terminal D coupled to the second node k2. The gate terminal G is at a fixed potential HV which is provided by the output o of the bias source 2. The bias source 2 is fed at node 17 either by the positive supply voltage VDD or by the potential of the first node k1, as indicated by the dotted line 33. For simplicity, the cascode circuit 1 will hereinafter also be referred to as a "cascode". A channel current "i" flows from subcircuit 3 to subcircuit 5 between nodes k1 and k2 via the cascode 1. Examples of suitable subcircuits 3 and 5 will be described in detail hereinbelow.

Figure 2:
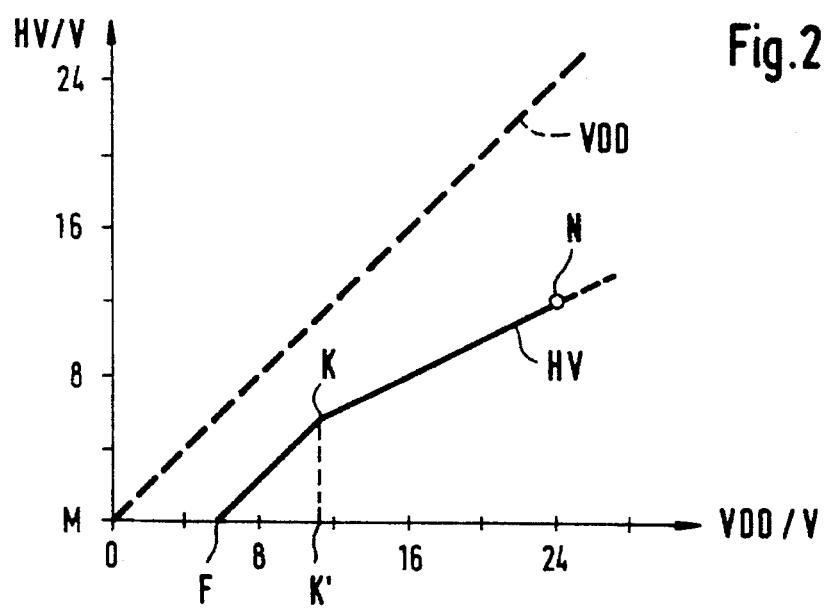
FIG. 2 shows the voltage waveform for driving the cascode circuit of FIG. 1.

FIG. 2 shows the gradient of the fixed potential HV, which is obtained from the output o of the bias source 2 of FIG. 1. At a supply voltage of, e.g., VDD=24 V, the fixed potential HV assumes a value N of approximately 12 V. As the supply voltage VDD decreases, the fixed potential HV decreases proportionally down to a first limiting value K, which corresponds to the value K' on the VDD axis. From there it decreases linearly until it reaches the ground reference level M at a second limiting value F.

In the starting range of the supply voltage VDD, i.e., in the range between 0 V and the second limiting value F, it is necessary for the fixed potential HV to be at or below ground potential M as soon as possible so that the p-channel current path i will be fully active (i.e., above pinch-off) at low VDD voltage values if possible. The exact gradient of the fixed potential HV between the first and second limiting values F and K, and between K and the maximum potential N, must only be predetermined such that no voltage breakdown will occur in any of the circuits 1, 3 or 5 at any voltage value VDD. The supply voltage VDD is divided by means of the subcircuit 2 such that the fixed potential HV is one half of VDD, for VDD greater than either K or another predetermined value less than K. Thus, up to a supply voltage VDD of 24 V, no circuit state is possible in the arrangements of FIG. 1 in which the potential HV is greater than 12 V.

Figure 3:
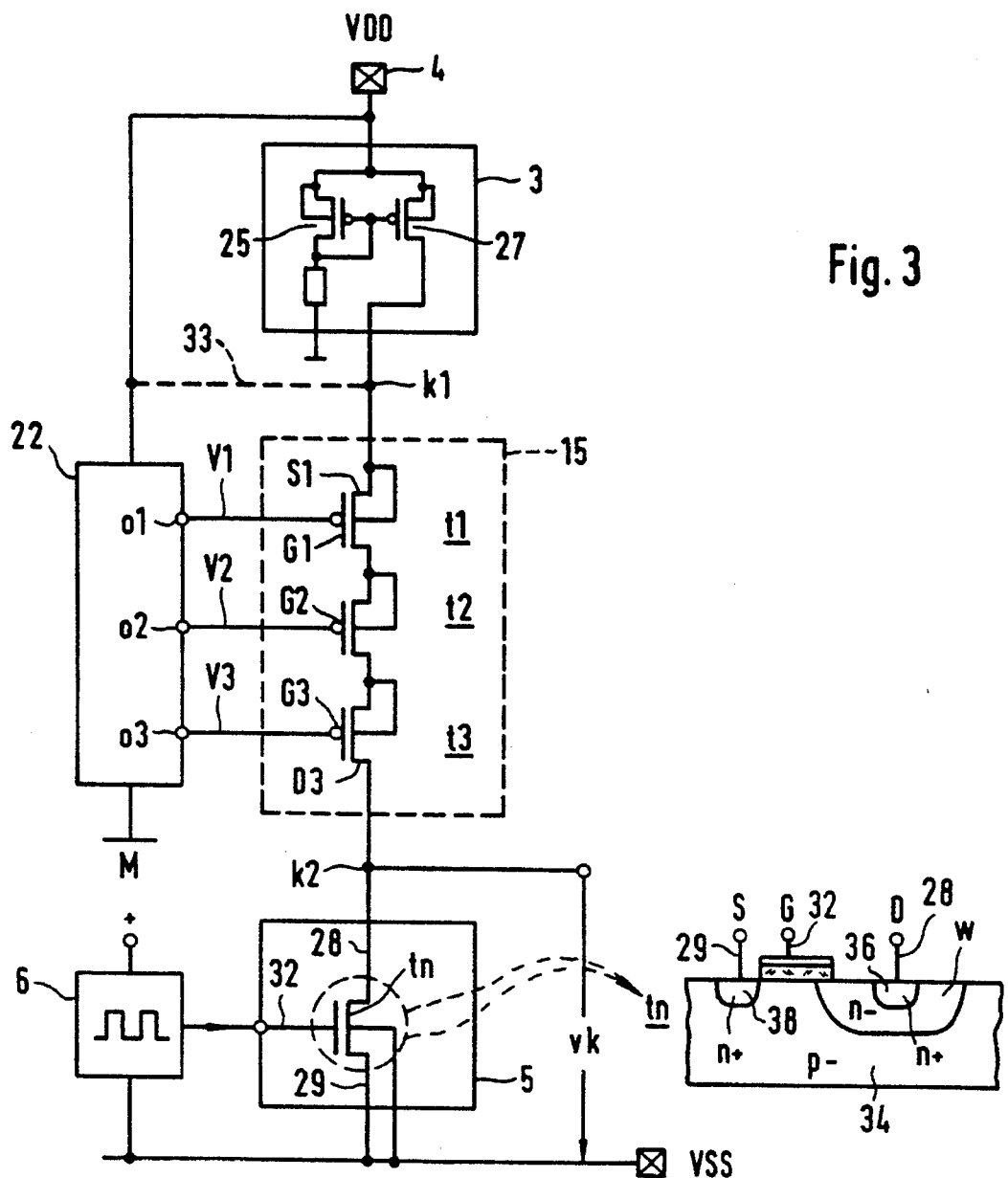
FIG. 3 is a schematic diagram of another embodiment of the invention.
Figure 4:
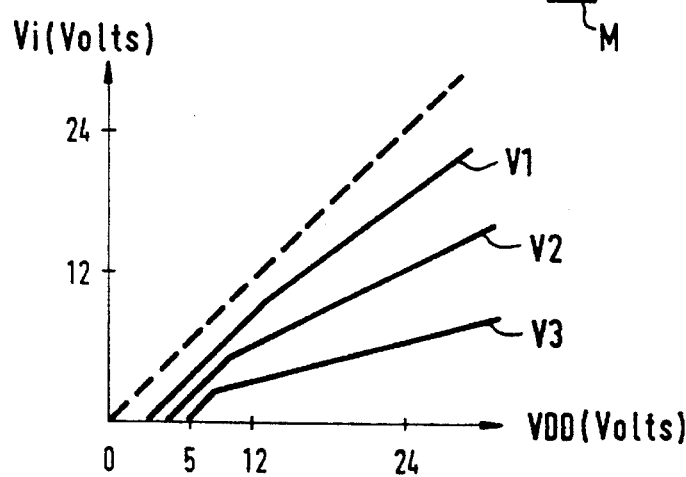
FIG. 4 shows the voltage waveform for driving the multi-stage cascode circuit of FIG. 3.

FIG. 3 shows schematically another embodiment of the invention which is very similar to the embodiment of FIG. 1. For convenience, like reference symbols are used to designate like components. The cascode circuit 1 has been replaced with a three-stage cascode circuit 15 which contains three p-channel transistors t1, t2, t3 coupled in series and acting as a cascode combination. The source terminal S1 of the first p-channel transistor t1 is connected to the first node k1, and the drain terminal D3 of the third p-channel transistor t3 to the second node k2. The first, second, and third gate terminals g1, g2, g3 are connected, respectively, to first, second, and third outputs o1, o2, o3 of the bias source 22, which provides first, second, and third fixed potentials V1, V2, V3 at the respective outputs. The three output bias source 22 thus replaces the single output bias source 2 of FIG. 1. The multi-stage cascode circuit 15 makes it possible to apply a supply voltage VDD of more than 24 V, with the potential difference being reduced by up to 12 V at each cascode stage. The respective fixed-potential gradients V1, V2, V3 are shown schematically in FIG. 4.

The first subcircuit 3 of the embodiment of FIG. 3 contains two p-channel FETS 25 and 27 configured as a current mirror whose output is coupled to the first node k1. The second subcircuit 5 contains a voltage-insensitive n-channel transistor $t_n$ having a drain terminal 28 connected to the second node k2, and a source terminal 29 coupled to receive the voltage VSS, and a gate terminal 32 that is clocked by a signal source 6. The second node k2 thus provides an output voltage Vk which corresponds either to approximately the VSS potential or to the positive supply voltage VDD, depending on the circuit state. That is, if $t_n$ is in a high impedance state, or "off", as controlled by the clock, the voltage Vk will float to a high value, approaching VDD. When $t_n$ is "on" Vk will approach the potential VSS.

A simplified sectional view of the voltage-proof n-channel transistor $t_n$ is shown beside the subcircuit 5. Into the p-type substrate 34 a lightly doped n-type well w has been formed in which a highly doped (n+) type region 36 is disposed approximately about its center. The highly doped (n+) type region 36 and the n-type well w form the drain region D of the n-channel transistor $t_n$. The source S is formed by a highly doped (n+) type region 38 as usual, and the gate region with the terminal G extends between the source S and drain D. Since the highly doped portion 36 of the drain region is surrounded by the lightly doped n-type well w, a space-charge region, which keeps the maximum field strength in the semiconductor material low, can form in the n-type well. Otherwise breakdown would occur at the junction boundary between the p-type substrate 34 and the highly doped (n+) type region 36.

Figure 5:
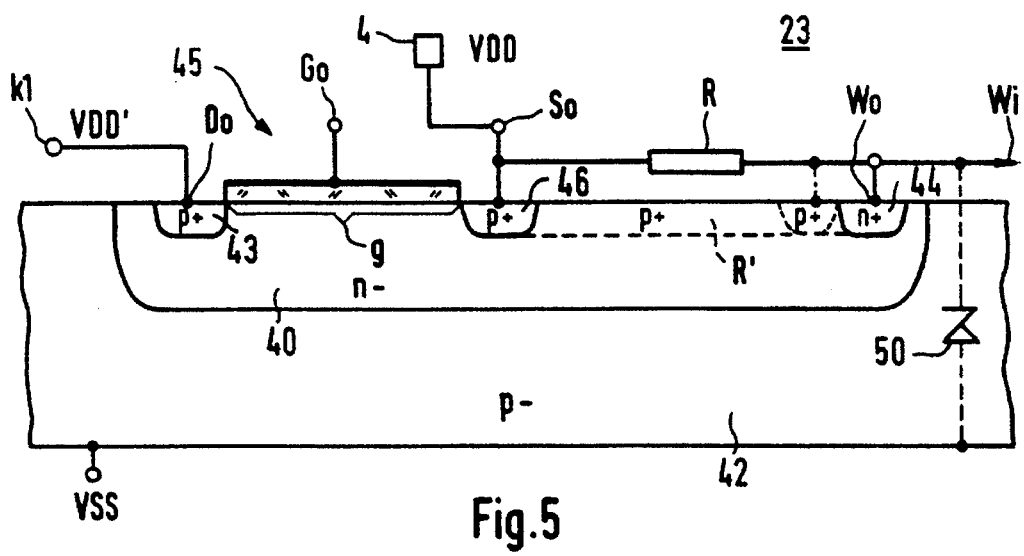
FIG. 5 is a schematic sectional view of the regions of a monolithic integrated protective circuit.

In FIG. 5, the first subcircuit 3 is designed as a protective circuit 23 which provides protection against reversal of the polarities of the positive and negative supply voltages VDD, VSS. The protective circuit additionally contains an overvoltage protection element 50. The operation of the polarity-reversal protection will be explained with the aid of the cross section of FIG. 5 through various semiconductor regions and with the aid of the two equivalent circuits of FIGS. 6 and 7. The essential portion of the protective circuit 23 consists of a p-channel transistor structure 45 with drain, gate, and source regions d, g, s. These regions have been formed into an n-type well 40. Contact to the n-type well 40 is made via a heavily doped (n+) type region 44. The peculiarity of this protective circuit lies in the fact that the well terminal Wo is connected via a resistor R to the source terminal So. Instead of employing an external resistor R, a specifically designed region in the n-type well 40 can be used. This is achieved, for example, by extending the (p+) type source region 46 as a resistance region R' which connects the source terminal So to the well terminal Wo. The protective circuit illustrated in FIG. 5 is the subject matter of co-pending U.S. patent application Ser. No. 08/318,150 filed on Oct. 5, 1994, which contains a detailed description of the protection circuit.

The normal operating state is defined as follows. The contact pad 4, to which the positive supply voltage VDD is applied, is connected by a low-impedance path to the source terminal So. The drain terminal Do feeds the first node k1, which serves as a further internal power supply terminal. The gate terminal Go is driven either by means of a switching signal or by means of a regulation signal. With the switching signal, the p-channel transistor structure to turned on, so that the potential VDD' at the first node k1 is nearly equal to the positive supply voltage VDD. With the regulation signal, the p-channel transistor structure to serves to regulate the current delivered at the first node k1. (Both applications are implemented in the embodiment of FIG. 9, as will be described). Since, through the resistor R or R', the n-type well 40 is also connected to the positive supply voltage VDD, reliable operation of the p-channel transistor structure 45 is ensured.

Figure 6:
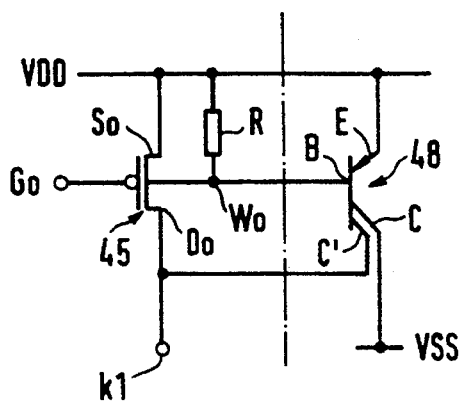
FIGS. 6 and 7 show equivalent circuits of the protective circuit of FIG. 5 in the normal and reverse-polarity conditions.

FIG. 6 shows the equivalent circuit of FIG. 5 during normal operation. The equivalent bipolar pnp transistor 48 is formed as follows: the source region 46 forms the emitter E, the n-type well 40 forms the base B, the substrate 42 forms the collector C, and the drain region 43 forms a lateral collector C'. If the source region 46 is extended to form the resistor R' the entire (p+) type region will, of course, form the emitter E. During normal operation, the equivalent transistor 48 is off, since base B and emitter E are short-circuited via the currentless resistor R or R'.

Figure 7:
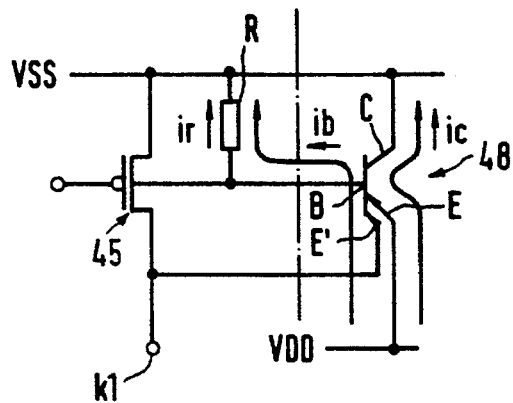

In the event of a polarity reversal, the pn diode formed by the substrate and the n-type well 40 is forward-biased. Now the resistor R or R' becomes active. The well current cannot flow directly via the contact pad 4 but must flow through the resistor R or R', which limits its value. The effects of this resistor R or R' will be explained with the aid of the equivalent circuit of FIG. 7, which includes the inversely operated equivalent pnp transistor 48. Through the polarity reversal, the association of electrodes between the p-channel transistor structure 45 and the equivalent pnp transistor structure 48 changes as follows: the substrate 42 forms an emitter E, which is to be regarded as the primary emitter; the lateral drain region 43 forms a lateral emitter E'; the n-type well 40 still forms the base B, and the source region 46, together with the (p+) type extension for the resistor R' if present, forms a single collector C. Compared with FIG. 6, the equivalent pnp transistor 48 is operated in an inverse mode. The collector current ic indicated in FIG. 7 is given approximately by the following transistor equation:

$$ic = Binv \times ib,$$

where ib=base current, ir=current through the resistor R, and Binv=inverse DC current gain of the equivalent pnp transistor 48. The effect of the lateral emitter E' is negligible since the major part of the well current is caused by the forward-biased, large-area well-substrate diode. The above equation shows that the maximum polarity-reversal current is dependent both on the inverse current gain Binv and on the magnitude of the base current ib and, hence, on the value of the resistor R (or R'). The circuit geometry and the doping of the respective regions are chosen so that the inverse current gain is approximately less than or equal to unity. Currents which flow through other n-type wells of the overall circuit may be critical if a large number of well terminals Wi are also connected through the resistor R. These currents add up to form the resistor current ir but do not increase the base current ib of the equivalent pnp transistor 48.

If an overvoltage protection element 50 is provided in the protective circuit of FIG. 5 to afford protection from excessive supply voltages VDD, this element will also be connected to the well contact Wo. A suitable overvoltage protection element 50 may be, for example, a buried zener diode which is formed by introducing appropriate regions into the semiconductor surface and whose breakdown voltage is settable relatively precisely by the fabrication process. Another suitable overvoltage protection element 50 is a field-oxide transistor, whose switching threshold is adjustable within wide limits by the field-oxide thickness so that it will become conducting with excessive voltage, thereby providing a low-impedance path to ground. Such a transistor, if it is an n-channel transistor, must be connected as follows: the source and bulk terminals are connected to ground potential M, and the gate and drain terminals are connected via a low-impedance path to the well terminal Wo. In the case of a permissible supply voltage VDD of 24 V, for example, an overvoltage protection element 50 must be provided whose breakdown voltage lies between 27 V and 32 V. If a separate contact pad is present for the well contact Wo, an external overvoltage protection element may be provided.

Figure 8:
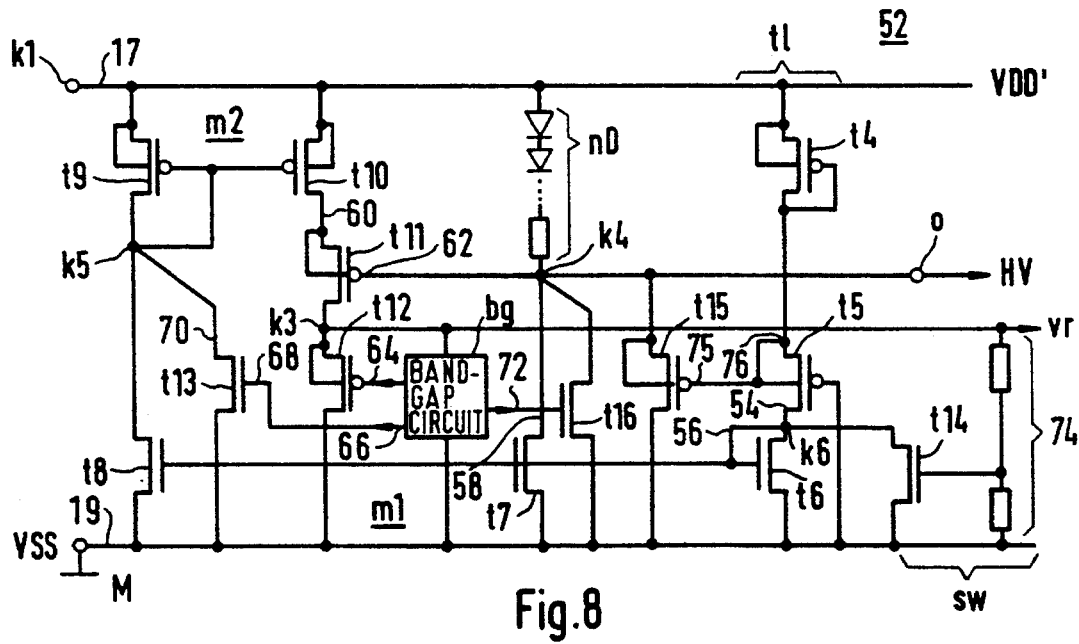
FIG. 8 shows a simple embodiment for generating a fixed potential.

FIG. 8 is a circuit diagram of a circuit 52 which can be used for the bias source 2 of FIG. 1. Terminals 17 and 19 and output o are then coupled to other circuit components as in FIG. 1. The fixed potential HV is to be obtained from the output o. The circuit 52 provides the potential HV approximately as the idealized gradient of FIG. 2. The bias source 52 has a terminal 17 coupled to the first node k1 and terminal 19 connected to negative supply voltage VSS, with the=first node k1 at the potential VDD', which is nearly equal to the positive supply voltage VDD. Clamping of the fixed potential HV to ground potential M in the starting range is accomplished by turning on a transistor t7 by means of a first current bank m1. The input of the latter is fed from a voltage divider t1 which is connected as a direct-current path between the first node k1 and the current-bank input and whose resisters are formed by two series-connected p-channel transistors t4, t5. The drain terminal 54 of the transistor t5 is the low end of the voltage divider t1 and feeds the interconnected drain-gate terminal of an n-channel transistor t6, which serves as the current-bank input. To ensure breakdown strength, the well terminals of the transistors t4 and t5 are connected to the respective source electrodes.

The first current bank m1 is formed from the n-channel transistors t6, t7, t8. The drain terminal 58 of the transistor t7 is connected via a fourth node k4 to a relatively high-impedance diode chain nD which, like the voltage divider t1, may consist of series-connected p-channel transistors, each acting as a diode. The respective width to length ratio of the gate regions of diode chain nD transistors, are higher than those of the transistors t4, t5, t6 of the voltage divider t1. The other end of the diode chain nD is connected to the first node k1. The current transfer ratio of the first current bank m1 is chosen so that in the starting range of VDD, approximately up to the second limiting value F, the transistor t7 can turn on the diode chain nD. The voltage at node k4 then approaches the VSS potential when VDD is below F volts.

The second output of the first current bank m1, formed by the transistor t8, is coupled via a fifth node k5 to the input of a second current bank m2. The input and output of the latter are formed by p-channel transistors t9 and t10, respectively. The drain terminal 60 of the transistor t10 is coupled, via a p-channel transistor t11 used in a cascode configuration, to a third node k3 and, acting as a pull-up element, pulls this third node k3 in the positive voltage direction. From the third node k3, which is coupled to the output transistor t12 of a band-gap circuit bg, a regulated auxiliary voltage, namely a band-gap output voltage vr of, e.g., 3.8 V, can be obtained. The cascode formed by the transistor t11 serves to increase the breakdown strength between the transistor t10 and the third node k3. The gate terminal 62 of transistor t11 receives the fixed potential HV. Since in the starting range the fixed potential HV is less than or equal to ground potential M, the p-channel transistor t11 is in the switch mode and is fully on during this time.

The pull-down element for the third node k3 is the above-mentioned transistor t12, a p-channel transistor in the embodiment of FIG. 8. The gate electrode 64 of this transistor is driven by an output of the band-gap circuit bg, whose supply-voltage and reference inputs are connected directly to the third node k3. An example of a suitable band-gap circuit bg is described in great detail in the above-mentioned German Patent Application P 42 42 989.7, the content of which is incorporated herein by reference. If less stringent requirements are placed on the regulated voltage vr, a simpler circuit will suffice to activate the pull-down element t12.

If the band-gap circuit bg is not yet active in the starting range of the positive supply voltage VDD, the pull-down element t12 is not yet active, either. The third node k3 is therefore at a potential vr slightly below the respective supply voltage VDD'. As VDD rises, so does the voltage vr. When vr reaches a value large enough for the band-gap circuit bg to enter the active state, the band-gap circuit bg then acts to limit the voltage vr, by means of the control action, to the above-mentioned exemplary value of 3.8 V. A further output 66 of the band-gap circuit bg drives the gate terminal 68 of an n-channel transistor t13, whose drain terminal 70 is coupled to the fifth node k5. By means of the transistor t13, the second current bank m2 is driven with an additional input current. This current will later replace the input current from the first current bank m1, which, after the starting phase of the reference voltage vr (which is also considered the band-gap regulated output voltage), will generally be switched off below the second limiting value F.

The approximately linear characteristic of the fixed potential HV between the second and first limiting values F, K (see FIG. 2) is implemented with an n-channel transistor t16 which is driven by a further output 72 of the band-gap circuit bg. Transistor t16 loads the node k4 in this range F, K with a constant current, to which the current of the source follower t15 is added when the limiting value K has been reached.

Upon activation of the band-gap circuit bg, whose regulated output voltage vr is also delivered to other subcircuits of the overall circuit (as will be seen in FIG. 9), a safe operating mode is reached in which the overall circuit can no longer latch up in an undefined mode even if the supply voltage VDD is still relatively low. When VDD is at its full supply voltage, for example, an undefined mode may result in destructions if the fixed potential HV for the cascode circuits has locked to a false value. The normal operating range is determined in FIG. 8 by a switch arrangement sw with an n-channel transistor t14 which is driven by the band-gap output voltage vr via a voltage divider 74 which determines a switching threshold. As soon as this voltage vr exceeds a predetermined value, transistor t14 turns on, thereby lowering the potential at node k6 to near the VSS potential, which disconnects the first current bank m1. As a rule, the switching threshold should be set so that transistor t14 switches for a VDD valve below the limiting value F, provided the band-gap circuit bg is already active.

In FIG. 8, the switch arrangement sw is connected to the band-gap output voltage vr to simplify the illustration. It would be more suitable, however, if the switch activation were initiated by a current path of the band-gap circuit bg, where this current path turns on last, because this would ensure that all important subcircuits are already active. A circuit arrangement which accomplishes this is described, for example, in the above-mentioned German Patent Application P 42 42 989.7 in connection with a starting circuit.

Through the disconnection of the first current bank m1, the output transistors t7, t8 of the latter are cut off. As a result, the diode chain nD pulls the potential of the fourth node k4 from ground potential M to a higher potential. The input current for the second current bank m2, as mentioned above, is supplied by the transistor t13, which is controlled by the band-gap circuit bg. Since the voltage at the fourth node k4 represents the fixed potential HV, which should normally be equal to half the supply voltage, VDD/2, the fourth node k4 must have a low source impedance. This is accomplished by means of the source follower consisting of the p-channel transistor t15 whose gate terminal 75 is connected to the center tap 76 of the voltage divider t1. The fixed potential HV is thus stabilized and can fix the gate potentials of the various cascode circuits, including, for example, that of transistor t11. The fact that the fixed potential HV is tied to the voltage-divider tap causes the proportional dependence of VDD from the limiting valve K. The transition region between the second limiting valve F and first limiting valve K is dependent on the switching threshold and the current-transfer behavior of the stages involved. If the bias source 2 has to generate several fixed potentials V1, V2, V3 as in FIG. 3, the voltage divider t1 will have corresponding taps which are connected to one source follower each. Each fixed-potential-generating facility contains its own, relatively high-impedance pull-up arrangement.

Figure 9:
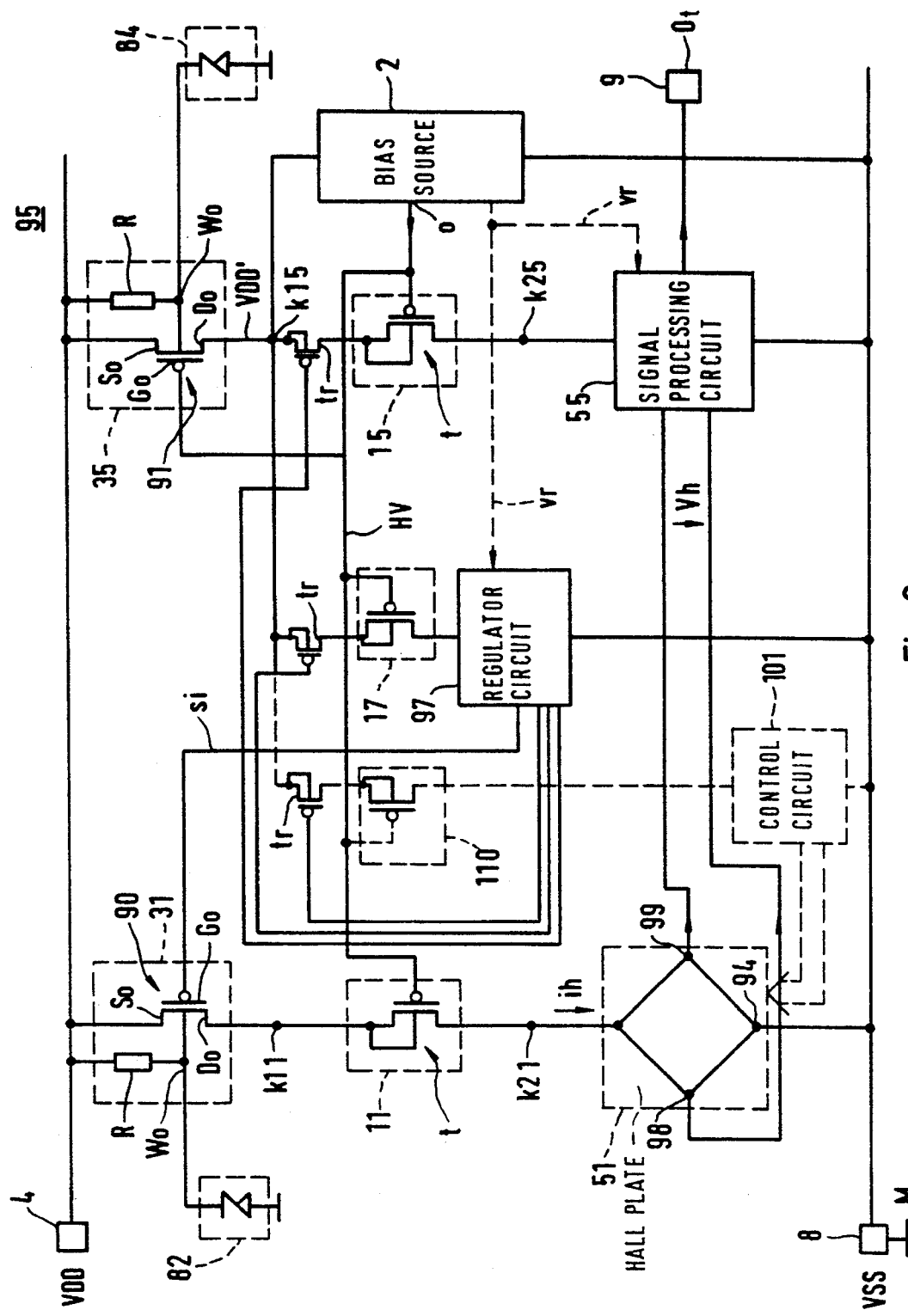
FIG. 9 is a schematic diagram of an embodiment of the invention in conjunction with a Hall-sensor circuit.

FIG. 9 shows an embodiment of the invention in conjunction with a Hall-sensor circuit 95 which can be connected directly to an unregulated supply voltage of 24 V. The Hall-sensor circuit 95 is protected against polarity reversals of the positive and negative supply voltages VDD, VSS. In addition, circuit 95 includes two overvoltage protection elements 82, 84, one at the respective well terminal Wo of each of the two p-channel transistor structures 90, 91. The Hall-sensor circuit 95 is a device having three terminals, with which the contact pads 4, 8, and 9 for the positive supply voltage VDD, the negative supply voltage VSS, and the output signal Ot are associated. Like reference numerals are used for convenience to designate the same components or circuit inputs as previously described.

The contact pad 4 has a regulated protective circuit 31 and switched protective circuit 35 connected thereto via a low-impedance path. The regulated protective circuit 31 generates an operating current ih for a monolithic integrated Hall plate 51, whose low end terminal 94 is connected to VSS. The Hall plate 51 senses a magnetic field and provides a difference in potential Vh between the taps 98, 99 as a function of the magnetic field sensed. The output of the regulated circuit 31 is at a first node k11, and the input for the operating current ih of the Hall plate is at a second node k21. An approximately 20-V difference voltage between the first and second nodes k11, k21 ocurrs across a cascode circuit 11 consisting of a p-channel transistor t whose gate terminal is connected to a fixed potential HV of approximately 12 V delivered by a bias source 2 at the output o. The bias source 2 may be implemented with a circuit as shown in FIG. 8. The regulated operating current ih for the Hall plate 51 is generated by driving the gate terminal Go of the regulated protective circuit 31 with a regulation signal si from a regulator circuit 97.

The regulated protective circuit 31 may be equivalent to the polarity-reversal protection structure of FIG. 5. That is, the transistor 90 structure may be equivalent to that of transistor 45, with the resistor R connected to the well terminal Wo, and so on. The switched protective circuit 35, which is also connected via a low-impedance path to the contact pad 4, contains the same elements as the regulated protective circuit 31, with transistor 91 being equivalent to transistor 90. From its output node k15 a positive supply voltage VDD' can be obtained which is only negligibly below the potential VDD of the contact pad 4. This follows from the fact that the gate terminal Go of transistor 91 is connected to the fixed potential HV, so that transistor 91 is turned fully on. The node k15 therefore serves as an internal terminal for the positive supply voltage VDD' of the CMOS circuit. A part of this circuit is implemented with an analog and/or signal-processing circuit 55, whose inputs are fed with the Hall-voltage difference Vh. Vh can be evaluated in the circuit 55 in analog, digital, or mixed form. In the example of FIG. 9, only a single output terminal 9 is present for the output signal Ot. In the simplest case, the Hall-sensor circuit 95 operates as a switch and provides a switching signal at the output terminal 9 when the magnetic field measured by the Hall plate 51 exceeds or falls below a predetermined value. For this application, only a low-cost three-lead package is necessary, which, however, involves the risk of a hook-up error in which VDD and VSS could be erroneously interchanged. Because of the two protective circuits 31 and 35, however, such a hook-up error has no negative consequences for the operation of the device.

Power is supplied to the circuit 55 via the single-stage cascade 15 inserted as a p-channel current path between the first and second nodes k15 and k25. The associated p-channel transistor t has its gate terminal tied to the fixed potential HV. Similarly, the regulator circuit 97 and any control circuit 101 that may be present are connected to the node k15 via cascode circuits 17 and 110, respectively. The regulator circuit 97 and the evaluating circuit 55 may be connected to the output supplying the regulated band-gap output voltage vr of the bias source 2 previously described with reference to FIG. 8. In the regulator circuit 97, the band-gap output voltage vr serves as a reference voltage to regulate the operating current ih by means of a replica (not shown) of the Hall plate 51 within the regulator circuit 97. In the evaluating circuit 55, the band-gap output voltage vr serves as a voltage reference for the Hall difference voltage Vh to control, for example, the switching function at the output terminal 9. The Hall plate 51 is indicated in FIG. 9 only schematically: Hall plate 51 may be a multiple-Hall-plate arrangement whose respective operating currents and voltage taps are cyclically switched by the control circuit 101, see, for example, European Patent Application EP-A-O 548 391 to S. Mehrgardt et al. and assigned to the assignee herein, the content of which is incorporated herein by reference.

Between the node k15 and each of the cascode circuits 110, 17, and 15, a p-channel transistor tr is inserted whose gate is controlled by a respective output of the regulator circuit 97. With this arrangement, only one protective circuit 35 as shown is needed to protect against reverse polarity operation. The individual regulation of the currents can then be accomplished in a simple manner by the ordinary p-channel transistors tr, which need no longer be protected against the destructive reverse mode. It should be pointed out that the regulated protective circuit 31 could also be replaced by a p-channel transistor tr connected to the node k15, but this would not be advisable because of the large operating currents ih of the Hall plate 51.

It should be understood that the embodiments described herein are merely exemplary and that a person skilled in the art may make many variations and modifications to the described embodiments utilizing functionally equivalent components to those described. All such variations and modifications are intended to be included within the spirit and scope of this invention as defined by the appended claims.

What is claimed is:

1. In a CMOS circuit having at least a first subcircuit coupled between a first point of potential and a first circuit node, and having a second subcircuit coupled between a second circuit node and a second point of reference potential, said first and second circuit nodes being coupled together, the improvement in combination therewith, comprising:

first circuit means coupled to the first point of potential for converting the first potential to a third potential as a function of the magnitude of said first potential, said third potential being of a value in between the first and second potentials;

a FET having source, drain, gate and well terminals, said source terminal being coupled to said well terminal and to said first circuit node, said third potential being applied to said gate terminal, said drain terminal being coupled to said second circuit node;

wherein said FET, in conjunction with said first circuit means, operates to provide a difference in potential between said first and second circuit nodes, thereby preventing voltage breakdown within said subcircuits.

2. The CMOS circuit according to claim 1, wherein:

said first point of potential is a positive potential;

said second point of reference potential is a negative potential;

said third potential is a potential in between said positive and negative potentials;

said FET comprises a first p-channel FET;

said first subcircuit includes a second p-channel FET having a drain terminal coupled to said first circuit node, a source terminal coupled to said first point of potential, a well terminal coupled to said source terminal, and a gate terminal for receiving a first control input;

said second subcircuit includes a first n-channel FET having a drain terminal coupled to said second circuit node, a source terminal coupled to said second point of potential, and a gate terminal for receiving a second control input, said second control input selectively being a high voltage level or a low voltage level;

wherein the potential at said second circuit node approaches said second potential when said second control input is said high voltage level, and approaches said first potential when said second control input is said low voltage level and wherein the potential at said first circuit node approaches said first potential independent of said second control input, thereby preventing voltage breakdown within said CMOS circuit.

3. The CMOS circuit according to claim 1, wherein said first potential is positive; said second potential is negative; and said third potential provided by said first circuit means is between zero and said second potential when said first potential is below a first predetermined value; said third potential being a linear function of said first potential with a first slope when said first potential is between said first predetermined value and a second predetermined value, and a linear function with a second slope less than said first slope when said first potential is between said second predetermined value and a third predetermined value.

4. The CMOS circuit according to claim 1, further including:

at least one other FET coupled between said first FET and said second node in a cascade configuration;

wherein said first circuit means provides at least one other potential to a gate terminal of said other FET, said other potential being in between the potential of said third potential and said second potential.

5. The CMOS circuit according to claim 1 wherein said first subcircuit comprises a polarity-reversal protection circuit including:

a resistor having two ends;

another p-channel FET having a source terminal coupled to the first point of potential, a drain terminal coupled to said first circuit node, a well terminal coupled to one end of the resistor, wherein the other end of said resistor is coupled to said first point of potential;

whereby during polarity reversal of said first and second potentials, current flows through said resistor, thereby preventing damage to said CMOS circuit.

6. The CMOS circuit according to claim 5 further including an overvoltage protective element coupled to said well terminal of said another p-channel FET.

7. The CMOS circuit according to claim 1 wherein said second subcircuit comprises a voltage-insensitive n-channel FET having n+type source and drain regions formed in a (p−) type well, with a (n−) type well surrounding said drain region, a gate for receiving a control input, and a well terminal;

wherein said well terminal is coupled to said second point of potential, said source region is coupled to said second point of potential, and said drain region is coupled to said second circuit node.

8. The CMOS circuit according to claim 1, wherein said first circuit means comprises:

a diode chain coupled between said first circuit node and a third circuit node, wherein said third potential is provided at said third circuit node;

a second p-channel transistor having: a gate terminal coupled to said third circuit node, a well terminal coupled to a source terminal, and a drain terminal;

a band gap circuit for providing a reference voltage at a fourth circuit node, wherein said fourth circuit node is coupled to said drain terminal of said second p-channel FET;

a third p-channel FET having: a well terminal coupled to a source terminal which is coupled to said first circuit node; a drain terminal coupled to said source terminal of said second FET;

a switch arrangement including an n-channel transistor driven by said reference voltage;

a source follower coupled between said third circuit node and said second point of reference potential for enabling the third potential to approximately equal one half of the first potential over a predetermined range of the first potential.

9. The CMOS circuit according to claim 5, further comprising a regulator circuit having an output signal which is provided to a gate terminal of said another FET, said regulator circuit regulating output current of said said second subcircuit.

10. The CMOS circuit according to claim 9 wherein said second subcircuit comprises an integrated Hall plate, said regulated output current being an operating current of said integrated Hall plate.

11. A CMOS circuit comprising at least a first subcircuit and a second subcircuit having different operating potentials, said first subcircuit coupled to a first node and said second subcircuit coupled to a second node, said first node and said second node being coupled together, the improvement in combination therewith, comprising:

a cascade circuit coupled between said first and second nodes having at least one p-channel FET in a cascade configuration, said FET having a source terminal coupled to said first node and receiving a first potential thereat, a drain terminal coupled to said second node, a well terminal, and a gate terminal;

a source of positive supply potential being applied to said first subcircuit, a source of negative supply potential being applied to said second subcircuit;

a bias source for converting said positive supply voltage to a fixed potential as a function of the magnitude of the positive supply voltage, such that, in a starting range of the positive supply voltage, the fixed potential corresponds to the negative supply voltage, the fixed potential increasing with increasing said positive supply voltage;

wherein said well terminal is coupled to a point of potential essentially equal to the first potential; and the fixed potential is applied to said gate terminal whereby said cascade circuit operates to drop internal effective voltage of said CMOS circuit between said first and second nodes, thereby preventing voltage breakdown within said CMOS circuit and increasing the breakdown strength of said CMOS circuit.

12. The CMOS circuit according to claim 11, further including:

at least one other FET coupled between said first FET and said second node in a cascade configuration;

wherein said bias source provides at least one other potential to a gate terminal of said other FET, said other potential being in between the potential of said third potential and said second potential.

13. The CMOS circuit according to claim 11, wherein said cascade circuit is controlled such that said cascade circuit is fully active in a starting range of said first point of potential, said first subcircuit comprises a second p-channel FET and said second subcircuit comprises a n-channel FET.

14. In a CMOS circuit having at least a first subcircuit coupled between a first point of potential and a first circuit node, and having a second subcircuit coupled between a second circuit node and a second point of reference potential, said first and second circuit nodes being coupled together, the improvement in combination therewith, comprising:

first circuit means coupled to the first point of potential for converting the first potential to a third potential as a function of the magnitude of said first potential, said third potential being of a value in between the first and second potentials;

a FET having source, drain, gate and well terminals, said source terminal being coupled to said well terminal and to said first circuit node, said third potential being applied to said gate terminal, said drain terminal being coupled to said second circuit node;

wherein said FET, in conjunction with said first circuit means, operates to provide a difference in potential between said first and second circuit nodes, thereby preventing voltage breakdown within said subcircuits;

at least one other FET coupled between said first FET and said second node in a cascade configuration; and wherein said first circuit means provides at least one other potential to a gate terminal of said other FET, said other potential being in between the potential of said third potential and said second potential.

15. A Hall-sensor circuit, comprising:

a first p-channel FET having a well terminal coupled to a source terminal which is coupled to a first circuit node, a drain terminal coupled to a second circuit node, and a gate terminal;

a protection circuit including a second p-channel FET having a drain terminal coupled to said first circuit node, a source terminal coupled to a first point of potential, and a gate terminal;

a Hall plate having an input terminal coupled to said second circuit node, an output terminal coupled to a second point of reference potential, and first and second voltage taps, said Hall plate operative to sense a magnetic field and provide a difference in potential between said first and second voltage taps as a function of the magnetic field;

a bias source coupled to said gate terminal of said first p-channel FET to provide a third potential thereat as a function of the magnitude of said first potential;

a regulator circuit for providing a control signal to the gate terminal of said second p-channel FET, said regulator circuit thereby regulating output current of said Hall plate;

whereby said cascode circuit is operative to provide a difference in potential between said first and second nodes, thereby increasing the breakdown strength of said Hall-sensor circuit.

16. The Hall sensor circuit according to claim 15 wherein said bias source comprises:

a diode chain coupled between said first circuit node and a third circuit node, wherein said third potential is provided at said third circuit node;

another p-channel transistor having: a gate terminal coupled to said third circuit node, a well terminal coupled to a source terminal, and a drain terminal;

a band gap circuit for providing a reference voltage at a fourth circuit node, wherein said fourth circuit node is coupled to said drain terminal of said another p-channel FET;

a further p-channel FET having: a well terminal coupled to a source terminal which is coupled to said first circuit node; a drain terminal coupled to said source terminal of said another FET;

a switch arrangement including an n-channel transistor driven by said reference voltage;

a source follower coupled between said third circuit node and said second point of reference potential for enabling the third potential to approximately equal one half of the first potential over a predetermined range of the first potential.

17. The Hall-sensor circuit according to claim 16 wherein said difference in potential at said voltage taps is provided to a signal processing circuit which provides a switching signal output when the magnetic field sensed is outside a predetermined range.

18. The Hall-sensor circuit according to claim 17 further comprising another protection circuit including a third p-channel FET having a having a source terminal coupled to said first point of potential, a gate terminal coupled to said gate terminal of said first FET wherein said third potential is provided thereat, and a drain terminal coupled to said bias source; and first and second overvoltage protection elements respectively coupled between the drain terminals of said second and third FETs and ground potential.

19. The Hall-sensor circuit according to claim 18, further comprising:

a fourth p-channel FET having a drain terminal coupled to said signal processing circuit, a gate terminal for receiving said third potential from said bias source, and a source terminal coupled to a well terminal;

a fifth p-channel transistor having a well terminal coupled to a source terminal which is coupled to said drain terminal of said third FET, and a gate terminal coupled to an output of said regulator circuit; and wherein said bias source supplies said regulation voltage to said signal processing circuit and to said regulator circuit.

20. The Hall-sensor circuit according to claim 19 further including:

a sixth p-channel transistor having a drain terminal coupled to said regulator circuit, a gate terminal coupled to said gate terminal of said fourth FET, and a well terminal coupled to a source terminal;

a seventh p-channel FET having a drain terminal coupled to said source terminal of said sixth p-channel FET, a gate terminal coupled to another output of said regulator circuit, and a source terminal coupled to said source terminal of said fifth FET.

21. The Hall-sensor circuit according to claim 20, further including a control circuit coupled to said Hall plate and to an eighth p-channel FET, said eighth p-channel FET having a gate terminal coupled to said gate terminal of said first p-channel FET.

\* \* \* \* \*